United States Patent
Westerlaken et al.

(10) Patent No.: US 10,114,298 B2
(45) Date of Patent: Oct. 30, 2018

(54) CONDITIONING SYSTEM AND LITHOGRAPHIC APPARATUS COMPRISING A CONDITIONING SYSTEM

(71) Applicant: ASML Netherlands B.V., Veldhoven (NL)

(72) Inventors: Jan Steven Christiaan Westerlaken, Heesch (NL); Alexandrios Mathew, San Diego, CA (US); Rob Johan Theodoor Rutten, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/327,343

(22) PCT Filed: Jun. 23, 2015

(86) PCT No.: PCT/EP2015/064113
§ 371 (c)(1),
(2) Date: Jan. 18, 2017

(87) PCT Pub. No.: WO2016/012175
PCT Pub. Date: Jan. 28, 2016

(65) Prior Publication Data
US 2017/0199470 A1    Jul. 13, 2017

(30) Foreign Application Priority Data
Jul. 23, 2014 (EP) .................................... 14178124

(51) Int. Cl.
*G03B 27/42* (2006.01)
*G03B 27/52* (2006.01)
*G03F 7/20* (2006.01)

(52) U.S. Cl.
CPC ...... *G03F 7/70866* (2013.01); *G03F 7/70341* (2013.01)

(58) Field of Classification Search
CPC ............. G03F 7/70933; G03F 7/70916; G03F 7/70875; G03F 7/20; G03F 7/70716; G03F 7/70725; G03F 7/70891
See application file for complete search history.

(56) References Cited

U.S. PATENT DOCUMENTS

2006/0061745 A1    3/2006    Aichi et al.
2008/0259293 A1    10/2008    Aichi
(Continued)

FOREIGN PATENT DOCUMENTS

JP    2005-142283 A    6/2005
JP    2006-086448 A    3/2006
(Continued)

OTHER PUBLICATIONS

Taiwan Office Action dated Jan. 6, 2017 in corresponding Taiwan Patent Application No. 104122207.
(Continued)

*Primary Examiner* — Mesfin Asfaw
(74) *Attorney, Agent, or Firm* — Pillsbury Winthrop Shaw Pittman, LLP

(57) ABSTRACT

A conditioning system for a lithographic apparatus having a plurality of modules. The conditioning system includes a plurality of conditioning branches conveying a common conditioning medium for the plurality of modules, one conditioning branch for each module (or a subset of modules); a plurality of thermal actuators, each thermal actuator operable to locally alter the temperature of the common conditioning medium at one of the conditioning branches; and a plurality of sensors, each sensor operable to sense the temperature of the common conditioning medium at one of the conditioning branches.

20 Claims, 2 Drawing Sheets

(56) References Cited

U.S. PATENT DOCUMENTS

2011/0017724 A1  1/2011  Martens et al.
2013/0045447 A1  2/2013  Kunnen et al.

FOREIGN PATENT DOCUMENTS

| JP | 2006-269762 A | 10/2006 |
|---|---|---|
| JP | 2009-517627 A | 4/2009 |
| JP | 2010-186895 A | 8/2010 |
| JP | 2011-029644 A | 2/2011 |
| JP | 2013-042127 A | 2/2013 |
| TW | 201314378 | 4/2013 |
| WO | 03/079418 A1 | 9/2003 |
| WO | 2007/063441 | 6/2007 |

OTHER PUBLICATIONS

International Search Report and Written Opinion dated Sep. 14, 2015 in corresponding International Patent Application No. PCT/2015/064113.
Notice of Reasons for Rejection issued in corresponding Japanese Patent Application No. 2016-574908 dated Nov. 2, 2017 with English translation.
Notice of Reasons for Rejection issued in corresponding Japanese Patent Application No. 2016-574908 dated Mar. 2, 2018 with English translation.

CONDITIONING SYSTEM AND LITHOGRAPHIC APPARATUS COMPRISING A CONDITIONING SYSTEM

CROSS-REFERENCE TO RELATED APPLICATIONS

This application is the U.S. national phase entry of PCT patent application No. PCT/EP2015/064113, which was filed on Jun. 23, 2015, which claims the benefit of priority of European patent application no. 14178124.5, which was filed on Jul. 23, 2014 and which is incorporated herein in its entirety by reference.

FIELD

The present invention relates to a conditioning system and method for a lithographic apparatus and a lithographic apparatus comprising such a conditioning system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A Lithographic apparatus may comprise a conditioning system for maintaining its constituent modules at a common temperature. Temperature differences between modules can have a negative effect on overlay during substrate processing. Such a conditioning system may comprise a conditioning medium (such as water) maintained at a desired temperature in a conditioning module (such as a cooling water cabinet), and then distributed to the modules to maintain the modules at the desired common temperature. However, a passive conditioning system such as this is insufficient to meet future overlay requirements, where temperature differences should be kept below 10 mK.

SUMMARY

It is desirable to provide an improved conditioning system for a lithographic apparatus.

According to an aspect of the invention, there is provided a conditioning system for a lithographic apparatus comprising a plurality of modules, said conditioning system comprising: a common conditioning medium for said plurality of modules; a plurality of conditioning branches arranged such that different individual modules or subsets of modules out of said plurality of modules are each conditioned via a corresponding conditioning branch conveying said common conditioning medium; a plurality of thermal actuators, each operable to locally alter the temperature of the common conditioning medium at one of said conditioning branches; and a plurality of sensors, each operable to sense the temperature of the common conditioning medium at one of said conditioning branches.

According to a further aspect of the invention, there is provided a method of conditioning a lithographic apparatus comprising a plurality of modules, said method comprising: conditioning each of different individual modules or subsets of modules out of said plurality of modules via a corresponding conditioning branch conveying a common conditioning medium; sensing the temperature of the common conditioning medium at each of said conditioning branches; and locally altering the temperature of the common conditioning medium at each of said conditioning branches so as to maintain said plurality of modules at a common temperature.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
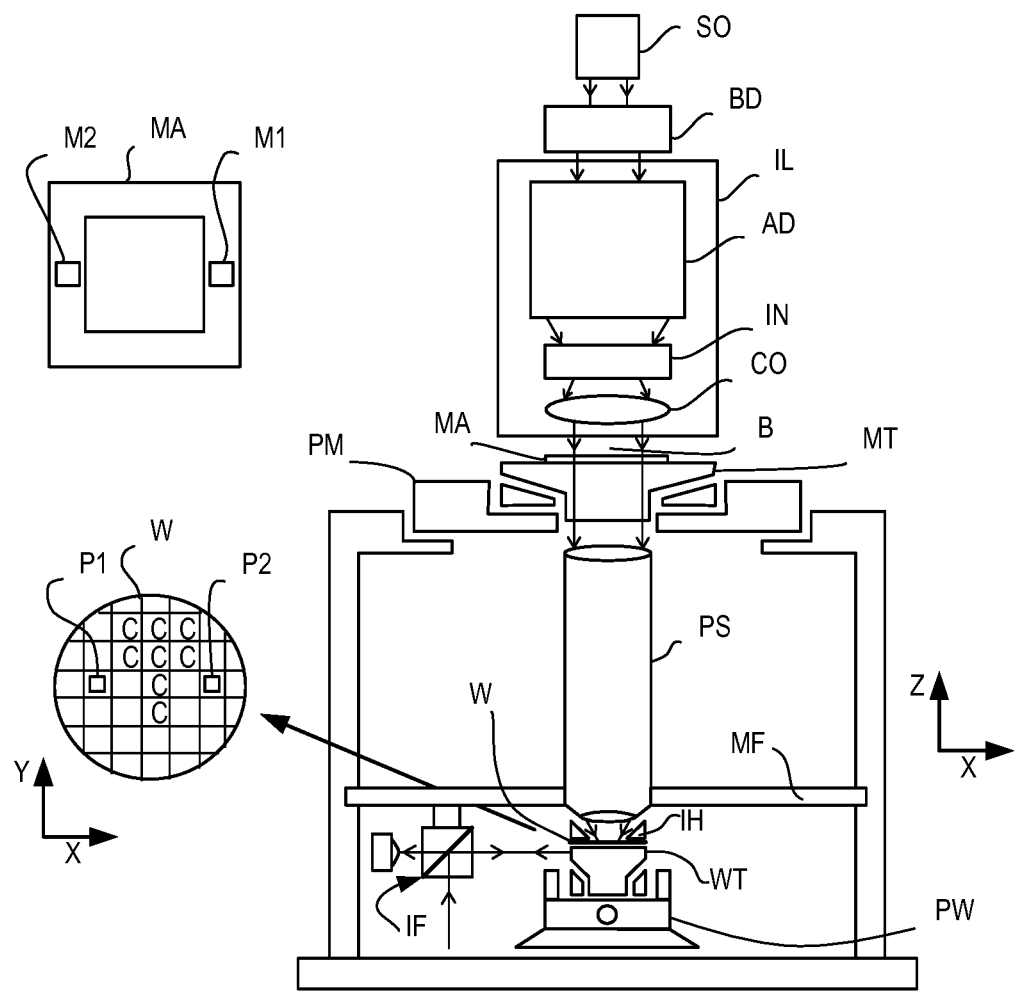
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W. The projection system PS is supported on a metrology frame MF.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small minors, each of which can be individually tilted so as to reflect an incoming radiation beam in different directions. The tilted mirrors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more substrate tables (and/or two or more mask tables). In such "multiple stage" machines (the wafer stage being the module comprising a wafer table) the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. Where the system is an immersion system, an immersion hood IH is provided. It is known to immerse the substrate in the lithographic projection apparatus in a liquid having a relatively high refractive index, e.g., water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g., quartz) suspended therein Immersion hood IH supplies immersion liquid to a space between the final element of the projection system PS and the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:
1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In some lithographic apparatuses, many performance critical modules (which may include sub-systems and/or components) are present which are sensitive to temperature changes and offsets between them. These modules include the wafer table WT, immersion hood IH, metrology frame MF, gridplates (which may be mounted to the metrology frame and act as metrology references), projection system PS, encoder block (on which the wafer table WT is clamped), wafer stage, position sensor IF (or other metrology device), wafer handler, mask MA, purging modules for purging (for example) the encoder block or alignment sensor. All of these modules may be conditioned directly or indirectly by a common conditioning medium: for example, a liquid such as the lens cooling water (LCW). In other embodiments, the common conditioning medium may be a gas, such as air.

Due to differences in pressure drop and heat sources through the system, the temperature levels of the modules are not equal. For example, due to heat load from the second positioner PW, the air that conditions the gridplates may be warmer than the common conditioning medium. This can result in the gridplates being at a higher temperature than the wafer table WT. Another example is that the common conditioning medium, may lose pressure as it is routed through the conditioning system, and (by way of particular example) the wafer table WT. This pressure drop causes the common conditioning medium entering the wafer table WT to increase in temperature. As a result, there is a temperature difference between wafer table WT and immersion hood IH and between wafer table WT and the wafer handler.

The temperature offsets between the modules can cause instabilities in overlay (pattern-to-pattern alignment of lithographic structures). For example, should the wafer from the wafer handler be warmer than the wafer table WT at the moment of substrate load, a heat flow will occur from substrate W to wafer table WT, causing the substrate W to deform during the measurement cycle. If the air from a wafer stage air shower (used to flush air through the wafer stage during production) is warmer than the air used for encoder purging, it will cause refractive index variation in the encoder beams, causing wafer stage positioning errors. These are just two examples.

In general temperature differences in the machine will cause two effects:
  A temperature difference between two modules will cause a heat flow when these two modules meet. This can cause thermo-mechanical deformation of the wafer or of components in the measurement loop (for example: wafer table WT, immersion hood IH, wafer handler, encoder block, gridplates, position sensor IF/metrology sensor).
  Temperature differences between two air supplies cause refractive index variation in the air (or other medium, e.g., immersion water), causing optical measurement errors (wafer stage, encoder purging, alignment purging, projection lens).

These temperature offsets may be in the order of 20 to 100 mK. However, future overlay specifications require temperature offsets to be improved by a factor of 10. Preferably, temperature offsets no greater than 10 mK are desired.

A conventional lithographic apparatus may comprise a conditioning system where the common conditioning medium is heated or cooled to a desired temperature within a common conditioning medium module. For example, when LCW is used as the common conditioning medium, the LCW will be sourced from and heated or cooled within a LCW cabinet. The common conditioning medium, at the desired temperature, is then output to the lithographic apparatus modules to condition their temperature and minimize the above temperature offsets. However, this method alone is not sufficient to reduce temperature offsets to meet the aforementioned future overlay specifications.

It is proposed herein to create a thermal matching functionality and strategy that aims, through calibration and control, to further reduce or eliminate the majority of the thermal gradients that exist during lithographic processes. This may be achieved at a system level by providing an active conditioning system which adjusts the temperature of each conditioning branch of a common conditioning medium, such that the whole lithographic apparatus is controlled to one predetermined temperature. The control factor for each conditioning branch may be decided by one calibration routine. Each conditioning branch may condition one of the modules of the lithographic apparatus.

Figure 2:
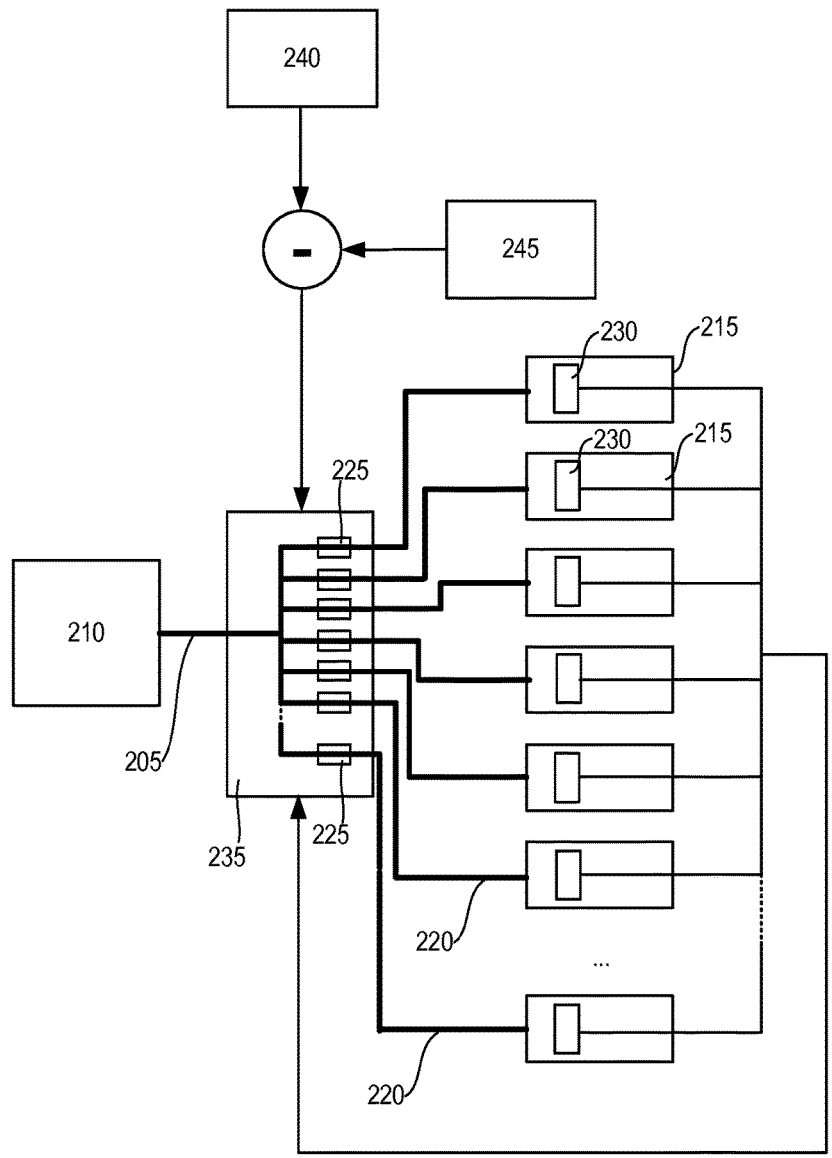
FIG. 2 comprises a conditioning system according to an embodiment of the invention.

FIG. 2 shows a conditioning system 200 according to an embodiment. Conditioning system 200 comprises conditioning medium pathways 205, shown as bold lines, (for example an LCW circuit) which convey a conditioning medium from a conditioning medium source 210 to a plurality of modules 215. The conditioning medium pathways 205 comprise a plurality of conditioning branches 220, one for each module 215 (or for a subset of said modules). Some or all of the conditioning branches 220 are each equipped, directly or indirectly, with a thermal actuator 225 (for example, a heating or cooling element). Each module or conditioning branch is also equipped with a sensor 230. In this example the thermal actuators 225 are comprised within a conditioning control unit 235. Alternatively each of the thermal actuators 225 may be located adjacent or within the immediate vicinity of a sensor 230 (within the module 215 or elsewhere in the conditioning branch 220) Immediate vicinity may mean that each sensor and its corresponding thermal actuator are less than 30 cm apart, less than 20 cm apart, less than 10 cm apart or less than 5 cm apart.

Preferably each sensor 230 should be placed as close to a point of interest as possible. A point of interest may be, for example, a point within a module 215 where a substrate being processed makes contact with a particular point in a module 215. In this way, the conditioning system 200 comprises functionality which enables local conditioning of each conditioning branch 220 which conditions the modules 215 within the context of the lithographic apparatus.

The conditioning control unit 235 processes signals which are output from each of the sensors 230; and sends control signals to the thermal actuators 225. The conditioning control unit 235 may receive as an input, temperature setpoints 240, offset with a calibration offset 245 to compensate for each sensor's un-calibrated readout for the same absolute temperature. The conditioning control unit 235 may control the thermal actuators according to the setpoints 240, offset with the calibration offset 245 for that sensor. Each module's sensor 230 and thermal actuator 225 operates in a feedback loop so that the temperature of the module is maintained at (or as close as possible to) the absolute temperature defined by temperature setpoint 240. In this way, the pressure drops and heat sources in the system as described above, are compensated for. The conditioning control unit 235 can comprise a single unit, as shown, or controllers may be distributed locally to the modules 215.

In a specific embodiment, these locally controlled branches condition some or all of the following modules 215:
  Wafer Table(s)
  Wafer Handler Fine Conditioning Table
  Encoder Purging
  Level Sensor Purging
  Metrology frame
  Projection lens
  Immersion hood and/or immersion fluid
  SPM gridplates (indirectly via metroframe and WS airshowers)
  WS encoder block (indirectly via immersion fluid and WS airshowers); and
  other environmental conditioning systems.
These modules are listed by way of example only, and embodiments may provide for conditioning of different modules, other modules and/or only a subset of these modules.

The lithographic apparatus may also comprise control software to execute a calibration routine to calibrate the sensors 230. The calibration routine may comprise the bringing together of two (or more) modules 215 to a common location, in the presence of a calibration medium, so that their sensors are in the vicinity of one another at the common location. One of the sensors has been already calibrated and/or the calibration medium has been previously thermally matched to a known temperature (thermal matching is described below). The calibration routine comprises calibrating the uncalibrated sensor(s) against the calibrated sensor and/or against the temperature of the calibration medium (provided it has been previously thermally matched). Alternatively or in addition, the calibration routine may comprise introducing an uncalibrated sensor to a previously thermally matched calibration medium (having a known temperature), and calibrating the uncalibrated sensor against the previously thermally matched calibration medium.

The calibration routine may also thermally match each of the modules with respect to the other modules and/or a common calibration medium. Thermal matching may comprise controlling the temperature of one or more modules and/or of a calibration medium so that the temperatures of the modules and/or the calibration medium are equalized. This thermal matching is performed when the module(s) and/or the calibration medium being thermally matched are at a common location, and may be performed simultaneously with the calibration steps described in the preceding paragraph. The control of the temperature may be achieved by adjusting the heat input to the modules or calibration medium using for example the appropriate thermal actuators.

The calibration medium may be the same as the common conditioning medium, or it may be a different medium. The calibration medium may be different at different common locations where a calibration is performed. The calibration medium may be a fluid (for example water or air), or a solid (for example a substrate).

Within a lithographic apparatus, some or all of the modules (including components for dispensing a fluid which may be used as a calibration medium, e.g., an air hose or water outlet) have a defined range of movement during normal operation. This is controlled by each module's own software sub-routine. The calibration routine may comprise a further sub-routine, which instructs discrete movements of two (or more) of these modules at a time, so that they are moved to a common location; the discrete movements being within each modules' defined range of movement. This may be done outside of production (at setup). There may be a number of different common locations, one for each calibration step where a particular sensor is calibrated. Each common location may be chosen to be an area that has one medium flowing through them (the calibration medium). Alternatively, a component for dispensing a fluid may also be moved to the area to provide the calibration medium.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of immersion lithography, it will be appreciated that the invention may be used in other applications, for example non-immersion optical lithography or imprint lithography, and where the context allows, is not limited to immersion lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A conditioning system for a lithographic apparatus comprising a plurality of modules, the conditioning system comprising:
a plurality of conditioning branches arranged such that different individual modules or subsets of modules out of the plurality of modules are each conditioned via a corresponding conditioning branch conveying a common conditioning medium for the plurality of modules;
a plurality of thermal actuators, each operable to locally alter the temperature of the common conditioning medium at one of the conditioning branches; and
a plurality of sensors, each operable to sense the temperature of the common conditioning medium at one of the conditioning branches,
wherein the conditioning system, with the lithographic apparatus, is operable to perform a calibration routine for calculating calibration offsets for the sensors, and
wherein the calibration routine comprises (i) bringing to a common location one or more uncalibrated sensors, a calibrated sensor, and a calibration medium, and calibrating the uncalibrated sensor(s) against the calibrated sensor, and/or (ii) bringing to a common location one or more uncalibrated sensors and a calibration medium of known temperature and calibrating the uncalibrated sensor(s) against the calibration medium of known temperature.

2. The conditioning system as claimed in claim 1, wherein;
the plurality of sensors comprises a dedicated sensor for each module or conditioning branch, which is operable to sense the temperature of its corresponding module or conditioning branch; and
the plurality of thermal actuators comprises a dedicated thermal actuator for each conditioning branch which is operable to locally alter the temperature of the common conditioning medium at its corresponding conditioning branch.

3. The conditioning system as claimed in claim 2, wherein each of the dedicated sensors is located in the immediate vicinity of a corresponding dedicated thermal actuator.

4. The conditioning system as claimed in claim 1, wherein the conditioning system comprises a controller operable to control the thermal actuators, based upon the output of the sensors, so as to maintain the plurality of modules at a common temperature.

5. The conditioning system as claimed in claim 4, wherein the controller and the plurality of thermal actuators are comprised within a single control unit.

6. The conditioning system as claimed in claim 1, wherein the calibration routine comprises the bringing to a common location one or more uncalibrated sensors, a calibrated sensor, and a calibration medium, and the calibrating the uncalibrated sensor(s) against the calibrated sensor.

7. The conditioning system as claimed in claim 1, wherein the calibration routine comprises the bringing to a common location one or more uncalibrated sensors and a calibration medium of known temperature and the calibrating the uncalibrated sensor(s) against the calibration medium of known temperature.

8. The conditioning system as claimed in claim 1, wherein the calibration routine is operable to control movement of the modules, each of the modules comprising one of the sensors and/or an outlet for the calibration medium, in order to bring the calibrated and uncalibrated sensors and/or the calibration medium together at one or more common locations.

9. The conditioning system as claimed in claim 8, wherein the movement of the modules comprises movement within each module's defined range of movement during normal operation of the lithographic apparatus.

10. The conditioning system as claimed in claim 1, wherein the calibration routine comprises equalising the temperatures of the modules and/or a calibration medium while the modules and/or the calibration medium are at a common location.

11. The conditioning system as claimed in claim 1, wherein the common conditioning medium comprises a conditioning fluid.

12. A lithographic apparatus comprising:
a conditioning system as claimed in claim 1; and
the plurality of modules.

13. The lithographic apparatus as claimed in claim 12, wherein the plurality of modules comprises one or more selected from: a wafer table, an immersion hood, a metrology frame, a gridplate, a projection system, an encoder block and/or a wafer stage.

14. The conditioning system as claimed in claim 1, wherein control of each thermal actuator takes into account a calibration offset for a corresponding sensor of the plurality of sensors, to compensate for the corresponding sensor's un-calibrated output for a same absolute temperature.

15. A method of conditioning a lithographic apparatus comprising a plurality of modules, the method comprising:
conditioning each of different individual modules or subsets of modules out of the plurality of modules via a corresponding conditioning branch conveying a common conditioning medium;
sensing the temperature of the common conditioning medium at each of the conditioning branches;

locally altering the temperature of the common conditioning medium at each of the conditioning branches so as to maintain the plurality of modules at a common temperature; and performing a calibration routine for calculating a calibration offset for a corresponding sensor used to sense the temperature of the common conditioning medium at the corresponding conditioning branch, wherein the calibration routine comprises (i) bringing to a common location one or more uncalibrated sensors and a calibration medium of known temperature and calibrating the uncalibrated sensor(s) against the calibration medium of known temperature, and/or (ii) bringing to a common location one or more uncalibrated sensors, a calibrated sensor, and a calibration medium, and calibrating the uncalibrated sensor(s) against the calibrated sensor.

16. The method as claimed in claim 15, wherein the calibration routine comprises the bringing to a common location one or more uncalibrated sensors, a calibrated sensor, and a calibration medium, and calibrating the uncalibrated sensor(s) against the calibrated sensor.

17. The method as claimed in claim 15, wherein the calibration routine comprises the bringing to a common location one or more uncalibrated sensors and a calibration medium of known temperature and calibrating the uncalibrated sensor(s) against the calibration medium of known temperature.

18. The method as claimed in claim 15, wherein the calibration routine is operable to control movement of the modules, each of the modules comprising a sensor and/or an outlet for the calibration medium, in order to bring calibrated and uncalibrated sensors and/or the calibration medium together at one or more common locations.

19. The method as claimed in claim 15, wherein the calibration routine comprises equalising the temperatures of the modules and/or a calibration medium while the modules and/or the calibration medium are at a common location.

20. The method as claimed in claim 15, wherein locally altering the temperature takes into account a calibration offset for a corresponding sensor used to sense the temperature of the common conditioning medium, to compensate for the corresponding sensor's un-calibrated output for a same absolute temperature.

* * * * *